United States Patent
Cojocaru et al.

(10) Patent No.: US 6,339,621 B1
(45) Date of Patent: Jan. 15, 2002

(54) ONE BIT DIGITAL QUADRATURE VECTOR MODULATOR

(75) Inventors: Christian Cojocaru; Theodore Varelas, both of Ottawa; Mark Cloutier, Aylmer; Luc Lussier, Orleans, all of (CA)

(73) Assignee: Philsar Electronics, Inc., Ottawa (CA)

( * ) Notice: Subject to any disclaimer, the term of this patent is extended or adjusted under 35 U.S.C. 154(b) by 0 days.

(21) Appl. No.: 09/135,243

(22) Filed: Aug. 17, 1998

(30) Foreign Application Priority Data

Aug. 15, 1997 (CA) .............................................. 2213156

(51) Int. Cl.[7] .............................................. H04B 14/06
(52) U.S. Cl. ....................................... 375/247; 375/261
(58) Field of Search ................................ 375/247, 261, 375/269, 283, 223, 298, 300, 302; 332/100, 103

(56) References Cited

U.S. PATENT DOCUMENTS

| | | | |
|---|---|---|---|
| 5,121,412 A | 6/1992 | Borth | 375/67 |
| 5,175,514 A | 12/1992 | Iinuma et al. | 332/103 |
| 5,225,795 A | 7/1993 | Iinuma | 332/103 |
| 5,345,406 A | 9/1994 | Williams | 364/724.01 |
| 5,418,818 A * | 5/1995 | Marchetto et al. | 375/264 |
| 5,432,483 A | 7/1995 | Maru et al. | 332/103 |
| 5,446,423 A | 8/1995 | Bienz et al. | 332/170 |
| 5,469,475 A | 11/1995 | Voorman | 375/247 |
| 5,534,827 A | 7/1996 | Yamaji | 332/103 |
| 5,534,828 A | 7/1996 | Okada et al. | 332/103 |
| 5,627,499 A | 5/1997 | Gardner | 332/101 |
| 5,701,106 A * | 12/1997 | Pikkarainen et al. | 332/100 |
| 5,714,916 A | 2/1998 | Yamaji | 332/103 |
| 5,727,024 A | 3/1998 | Hauptmann | 375/247 |
| 5,764,171 A * | 6/1998 | Stikvoort | 341/143 |
| 5,767,750 A * | 6/1998 | Yamaji | 332/103 |
| 5,768,315 A | 6/1998 | Mittel et al. | 375/247 |
| 5,909,460 A * | 6/1999 | Dent | 375/200 |

FOREIGN PATENT DOCUMENTS

| | | | | |
|---|---|---|---|---|
| CA | 1 191 958 | * | 8/1985 | 354/69 |
| CA | 1 238 697 | * | 6/1988 | 332/60 |
| CA | 2072568 | * | 6/1991 | 001/6 |
| CA | 2212146 | * | 7/1997 | 3/2 |
| NO | WO 98/20657 | * | 5/1998 | |

OTHER PUBLICATIONS

Decimation for Bandpass Sigma–Delta Analog–To–Digital Conversion, R. Schreier et al., University of Toronto; 1990, pp. 1801–1804;.*
Bandpass Sigma–Delta Modulation, Electronics Letters, Nov. 9, 1989, vol. 25, No. 23, pp. 1560–1561.*

* cited by examiner

*Primary Examiner*—Mohammad H. Ghayour
(74) *Attorney, Agent, or Firm*—Thomas, Kayden, Horstemeyer & Risley, LLP

(57) ABSTRACT

A One Bit Digital Quadrature Vector Modulator (DQVM) and a method of generating single sideband output signals are useful for a wide range of radio frequency, signal processing and wireless applications. The DQVM simplifies the necessary digital multiplication by using noise shaped one bit versions of both the baseband $I_B$ and $Q_B$ signals to be modulated and the $I_{LO}$ and $Q_{LO}$ modulating signals. The one bit DQVM enables a much faster digital implementation of the digital quadrature vector modulation function than can be achieved with conventional multi-bit digital techniques. In addition the single sideband upconversion of the DQVM achieves high suppression of the unwanted sideband by applying an offset to one of the low speed input samples. Digital vector modulators are an improvement over conventional analog vector modulators as they are not subject to the amplitude and phase matching problems inherent in analog vector modulators.

23 Claims, 8 Drawing Sheets

US 6,339,621 B1

ONE BIT DIGITAL QUADRATURE VECTOR MODULATOR

FIELD OF THE INVENTION

The present invention relates to electronic signal processing and, in particular, to a digital quadrature vector modulator using a single bit delta-sigma modulation and a method for generating signals using the same.

BACKGROUND OF THE INVENTION

The invention applies to the fields of electrical engineering, electronics, communications engineering and signal processing. The quadrature modulation technique is applicable to virtually all quadrature modulation schemes, which include for example, Quadrature Amplitude Modulation (QAM), Quadrature Phase Shift Keying (QPSK), Quadrature Quadrature Amplitude Modulation ($Q^3AM$), Orthogonal Frequency Division Modulation (OFDM) and many others schemes.

Analog Quadrature Vector Modulation (AQVM)

Quadrature Vector Modulation using analog techniques is currently in wide use in communications and in many other fields which require signal processing. Commercial AQVMs, such as that illustrated in FIG. 1, are available from suppliers such as Mini-Circuits Division of Scientific Components, Hewlett-Packard Co., Watkins Johnson Co., Analog Devices, Inc. and many others. These devices are useful for general signal processing applications and are often used to implement single side-band (SSB) radio frequency signal modulation. Typical input spectrum 20 and output spectrum 22 for SSB AQVMs are shown in FIG. 2. The multiplier functions in AQVMs are often realized using diode mixers, field effect transistor (FET) based mixers, four quadrant multipliers such as Gilbert cells, or other analog multiplication techniques. The quadrature components for the input signal may be created using hybrid baluns if the bandwidth of the input signal is limited. In communications systems the input signals are often digital baseband signals, the quadrature components being generated digitally and subsequently converted to baseband analog signals before they are input to the AQVM.

In general a signal 24, $f_B$, to be input to an AVQM is split (by e.g. a splitter 2 shown in FIG. 1) into in-phase and quadrature components, $I_B$ and $Q_B$ respectively. The quadrature input signals may be generated using analog techniques, but, as noted above, are usually generated digitally and converted into analog prior to input to the vector modulator. As shown in FIG. 1, an analog modulating signal, often generated by a local oscillator (LO) 4 is also split by a splitter 6 into quadrature components, $I_{LO}$ and $Q_{LO}$. The quadrature components and the in-phase components are multiplied by multipliers 8 and summed by a summer 10 to produce $I_B*I_{LO}+Q_B*Q_{LO}$. The resulting output creates upper and lower sideband products 28 and 30 centred about the local oscillator frequency 26 as shown in FIG. 2. The lower sideband 28 is composed of in-phase I and Q products while the upper sideband 30 is composed of products of opposite phase. If the amplitude and phase matching of the analog modulators is very good, the upper sideband (USB) signal amplitude will be very small compared to the in-phase lower sideband (LSB) signal amplitude. The ratio 32 of the amplitude of the in-phase sideband to the out-of-phase sideband products is often referred to as the image rejection, image suppression or sideband suppression. The cancelled sideband is often referred to as the image.

In a similar fashion an upper sideband may be obtained by interchanging the $I_{LO}$ and $Q_{LO}$ products to obtain $I_B*Q_{LO}+Q_B*I_{LO}$.

It is desirable in many communications applications to conserve bandwidth by using only a single sideband of the modulation products. However, because the frequency offset of the image (i.e. the unwanted sideband) from the desired sideband signal, $f_{LO}-(f_{LO}-f_B)$, is often very small compared to the local oscillator frequency, $f_{LO}$, it may be very difficult or impossible to remove the image frequency by means of a filter. For this reason the image rejection performance (i.e. the unwanted sideband suppression) of the AQVM is of critical importance to the overall performance of the modulation technique and can be a fundamental limiting factor in the use of the technique. The image rejection of AQVMs varies depending upon the application, but is typically between 15 and 45 dB. Rejection above 30 dB often requires special manual tuning and often varies with temperature and frequency. For these reasons AQVMs can be costly to implement in large volume applications.

The Shannon-Hartley theorem (*Modern Quadrature Amplitude Modulation*, Webb and Hanzo, IEEE Press 1995, p. 39) states that the capacity and maximum transmission rates of a communications channel are limited by the available carrier to noise ratio. The image level from digital quadrature modulators presents noise like interference to the modulation scheme and hence poses a fundamental limit to the level of modulation and transmission rates which can be achieved using these analog modulators.

Digital Quadrature Vector Modulation (DQVM)

As taught by the Nyquist Sampling Theorem, it has long been understood that communications signals may be fully represented by their digital equivalents (*Certain Factors Affecting Telegraph Speed*, H. Nyquist, Bell System Tech Journal, April 1928, pp. 617). It is also widely known that quadrature vector modulation can be accomplished using digital techniques. Digital signals, however suffer from noise caused by the quantization process. The signal-to-noise ratio (S/N) of a signal quantized to n bits and having an equal probability of existing at each of the $2^n$ levels, is given by the relationship $20 \log(n^2-1)$ dB and increases by 6 dB per bit (*Introduction to Communication Systems*, F. G. Stremmler, Addison Wesley 1977 pp. 455).

Conventional digital modulators can be implemented in many forms. For example commercially available dedicated hardware multipliers, for instance, from Analog Devices Inc., can be used. Dedicated signal processing components such as the Texas Instruments TMS320 family of digital signal processor integrated circuits may also be used. It is also possible to implement a digital modulator in software using general purpose computers such as the Intel x86 family of processors. Conventional Digital Signal Processors (DSP) can achieve excellent image rejection due to the level of phase and amplitude matching which can be maintained in the digital process.

Conventional DSP techniques quantize both the baseband and the modulating signals to a sufficient number of bits to keep the noise to acceptable levels for the system application. Modern communications systems often require 10 bit quantization or higher.

Conventional DSP requires a number of multi-bit digital multiplications to be executed to complete the modulation function. These multiplications must be executed in real time. The circuits required to execute such multiplications utilize a large number of digital gates that consume a relatively large amount of power, and are limited in their maximum clock rates due to the size and complexity of the digital computations required. Because of the size of the integrated circuits involved, multi-bit multiplication circuits are relatively expensive and operate at slower clock speed than single bit digital circuits using the same technology. The use of multi-bit digital quadrature vector modulation is therefore often limited in its applicability to high speed communications systems because of cost, complexity, size, power requirements, and performance limitations of the circuits required by conventional techniques.

Delta Sigma (ΔΣ) Modulation

Over the past twenty years a number of authors have described ΔΣ modulators for use as Digital-to-Analog Converters (DACs). See for example *Oversampling Delta-Sigma Data Converters,* Candy and Temes, IEEE Press (1992). Delta Sigma modulation is a method of achieving high signal-to-noise ratios over limited bandwidths using single bit signals modified by feedback. ΔΣ modulators require high sampling rates relative to the applied signal. To date ΔΣ modulators have not been widely used in communications applications because of the need for very high clock rates to support the required sampling rates. This is changing, however, as semiconductor feature sizes allow faster and faster clock rates. It is therefore now possible to use ΔΣ modulators in communications applications, and these are now commercially available as, for example the National Semiconductor ADC16701.

SUMMARY OF THE INVENTION

It is an object of the present invention to provide a means for performing quadrature vector modulation digitally using circuits which are more readily adaptable to high volume manufacturing than conventional multi-bit digital modulation, and for achieving high suppression of the unwanted sideband in the single sideband upconversion of the DQVM.

The One Bit Digital Quadrature Vector Modulator (DQVM) and a method of generating single sideband output signals of the present invention are useful for a wide range of radio frequency, signal processing and wireless applications. The DQVM simplifies the necessary digital multiplication by using noise shaped one bit versions of both the baseband $I_B$ and $Q_B$ signals to be modulated and the $I_{LO}$ and $Q_{LO}$ modulating signals. The one bit DQVM enables a much faster digital implementation of the digital quadrature vector modulation function than can be achieved with conventional multi-bit digital techniques. Digital vector modulators are an improvement over conventional analog vector modulators as they are not subject to the amplitude and phase matching problems inherent in analog vector modulators. Furthermore, the single sideband upconversion of the DQVM of the present invention achieves high suppression of the unwanted sideband by applying an offset to one of the input samples.

In accordance with one aspect of the present invention, there is provided a method for producing a single bit stream using digital quadrature vector modulation. The method starts by receiving multi-bit digital in-phase and quadrature input signals at a baseband sample rate. An offset is implemented on one of the input signals at the baseband sample rate. The offset input signal and the other one of the input signals are modulated into single bit delta-sigma (ΔΣ) coded bitstreams at a modulator sampling rate which is faster than the baseband sample rate. Orthogonal clock signals are created at a sampling rate equal to the modulator sampling rate and an effective frequency equal to one half of the modulator sampling rate. Then, the ΔΣ coded bitstreams are multiplied with the orthogonal clock signals so as to create two product single bit streams at the modulator sampling rate. The two product single bit streams are alternately combined into a interleaved single bit stream so that the interleaved single bit stream is clocked at a rate twice the modulator sampling rate.

In accordance with another aspect of the present invention, there is provided a Digital Quadrature Vector Modulator (DQVM) system comprising an offset implementing unit for implementing an offset on one of multi-bit digital in-phase and quadrature input signals received at a baseband sample rate; a first one bit delta-sigma (ΔΣ) modulator for receiving and modulating the offset input signal at a modulator sampling rate which is faster than the baseband sample rate, and outputting a single bit ΔΣ coded bitstream of the offset input signal; a second one bit ΔΣ modulator for receiving and modulating at the modulator sampling rate a non-offset input signal which is the other one of the input signals, and outputting a single bit ΔΣ coded bitstream of the non-offset input signal; means for creating orthogonal clock signals at a sampling rate equal to the modulator sampling rate and an effective frequency equal to one half of the modulator sampling rate; a first multiplier for multiplying the ΔΣ coded bitstream of the offset input signal with one of the orthogonal clock signals so as to create a first product single bit stream based on the offset input signal; a second multiplier for multiplying the ΔΣ coded bitstream of the non-offset input with the other one of the orthogonal clock signals so as to create a second product single bit stream based on the non-offset input signal; and a multiplexer for alternately combining the first and second product single bit streams into a interleaved single bit stream so that the interleaved single bit stream is clocked at a rate twice the modulator sampling rate.

Other advantages, objects and features of the present invention will be readily apparent to those skilled in the art from a review of the following detailed descriptions of the preferred embodiment in conjunction with the accompanying drawing and claims.

BRIEF DESCRIPTION OF THE DRAWINGS

The embodiments of the invention will now be described with reference to the accompanying drawings, in which.

DESCRIPTION OF THE PREFERRED EMBODIMENTS

Figure 4:
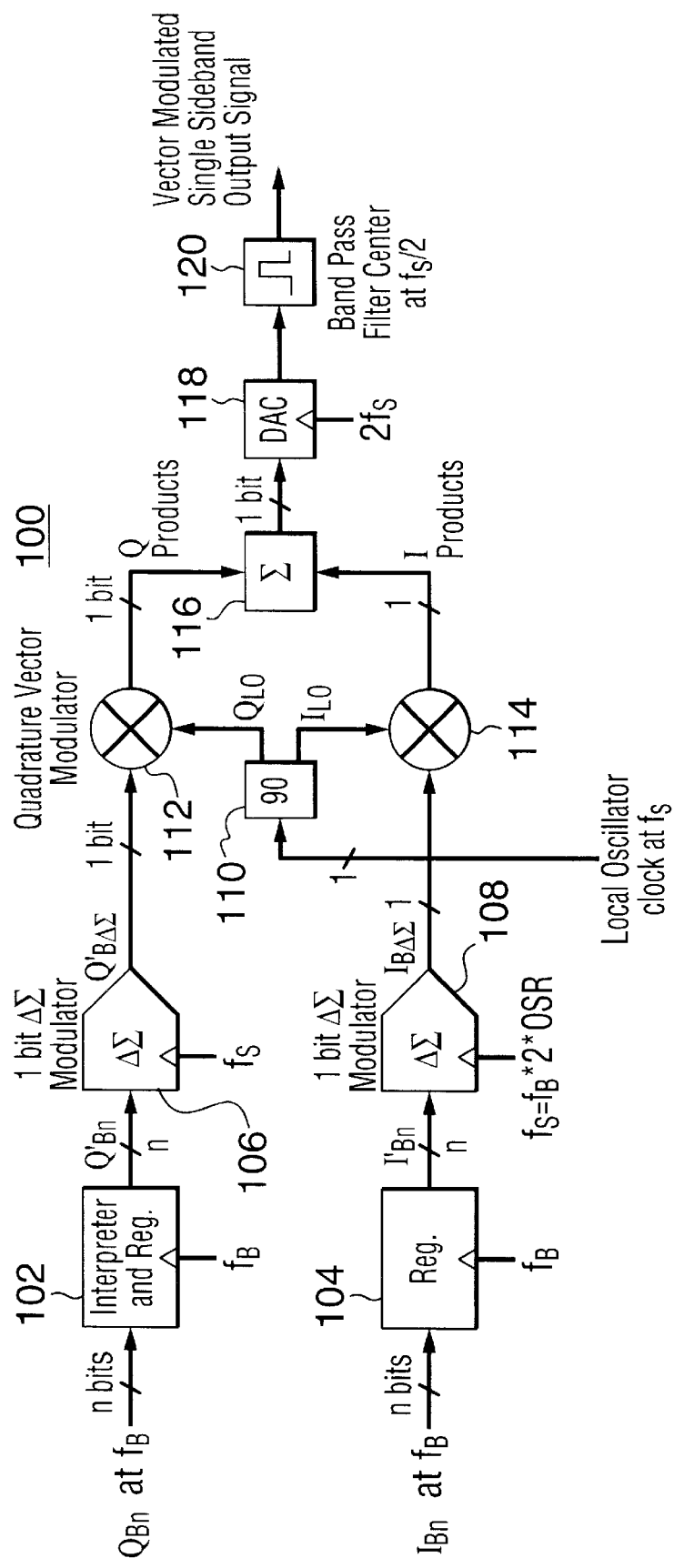
FIG. 4 is a functional block diagram of an embodiment of a one bit Digital Quadrature Vector Modulator (DQVM) in accordance with the present invention.
Figure 5:
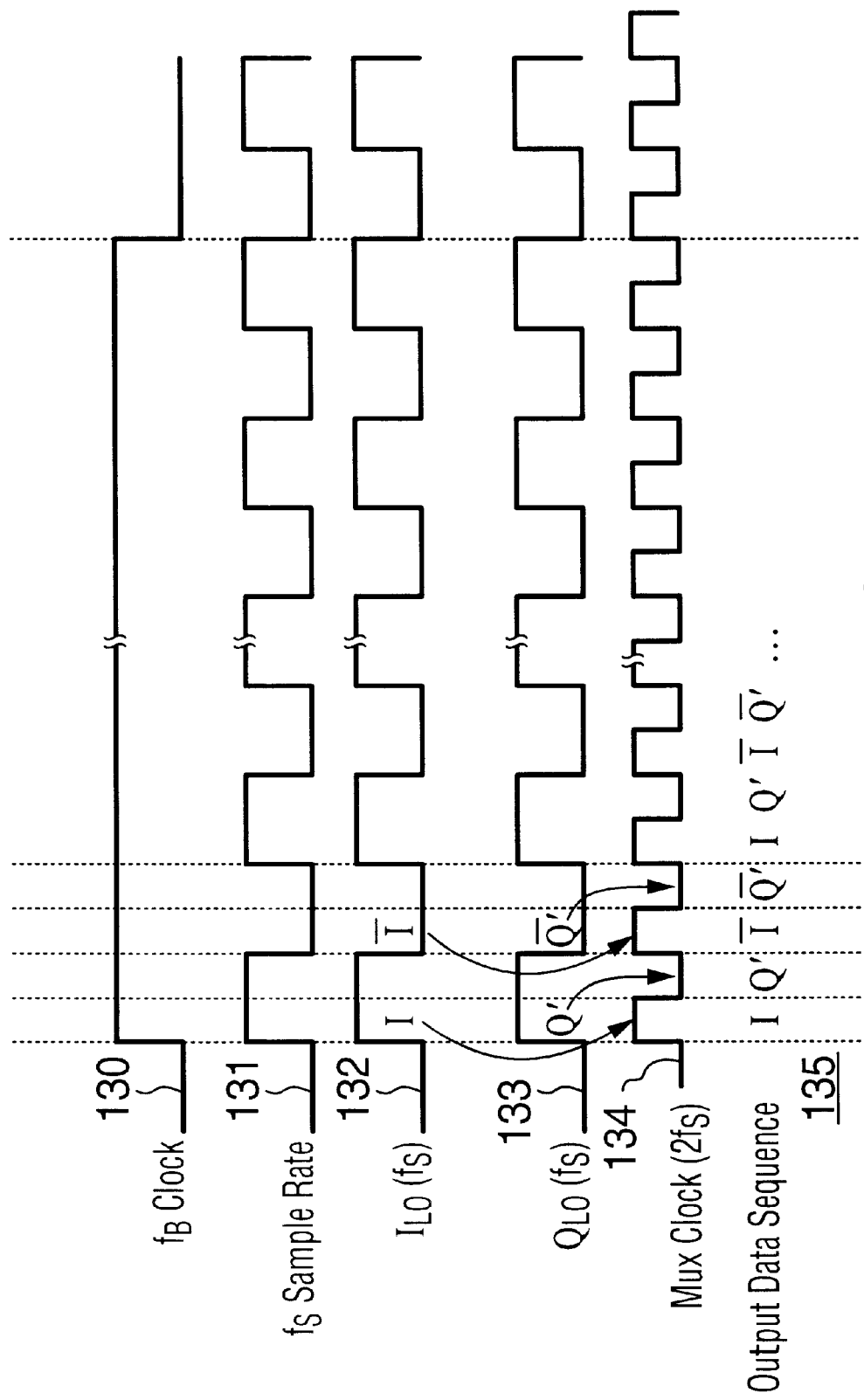
FIG. 5 is a chart showing the relative timing of select waveforms in the one bit DQVM.
Figure 6:
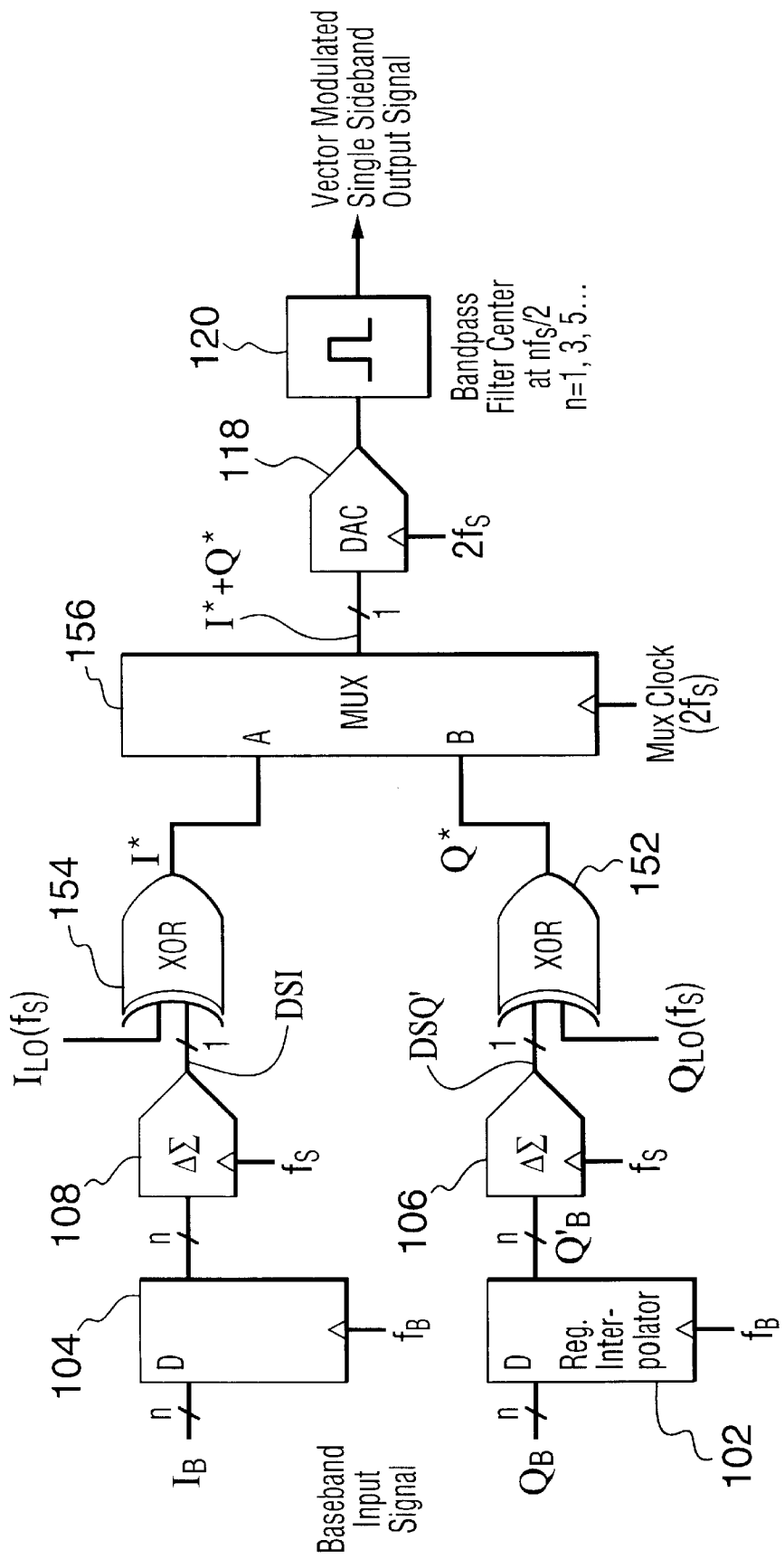
FIG. 6 is an example of a preferred embodiment of the one bit DQVM.

With reference to FIGS. 4 to 6, the embodiments will describe a lower side-band realization. Realization of the upper sideband version of the invention is a straight forward adaptation of the process described herein.

FIG. 4 shows a block diagram of a Digital Quadrature Vector Modulator (DQVM) 100. The DQVM 100 generally consists of sections to implement the following functions; (1) A section to receive two (2) multi-bit (where n is the number of bits) digital quadrature input signals $I_{Bn}$ and $Q_{Bn}$ and where the signal sample rate is $f_B$ samples per second; (2) a section or method to implement a delay on the $Q_{Bn}$ data, and to output the delayed data, $Q'_{Bn}$; the delay is equivalent to one period of the Digital Analog Converter (DAC) clock, $T_{DAC}=1/2f_B$; (3) a section or method to modulate the multi-bit quadrature signals $I_{Bn}$ and $Q'_{Bn}$ into single bit $\Delta\Sigma$ coded bitstreams $I_{B\Delta\Sigma}$ and $Q'_{B\Delta\Sigma}$ at a modulator sampling rate $f_S$, $f_S=f_B*2*OSR$, where OSR is the Over Sampling Ratio (OSR); (4) a section or method to create orthogonal $I_{LO}$ and $Q_{LO}$ clock signals, which will play the function of local oscillators, and where the orthogonal clock signals are represented by single bit words at a sampling rate equal to the sampling rate of the $\Delta\Sigma$ bitstreams; (5) a section or method to multiply the $I_{B\Delta\Sigma}$ and $Q'_{B\Delta\Sigma}$ bitstream with the $I_{LO}$ and $Q_{LO}$ clocks where the high clock signal will not change the input data bit and where a low clock signal will invert the input data bit, thus creating the two product single bit streams $I_{B\Delta\Sigma}*I_{LO}$ and $Q'_{B\Delta\Sigma}*Q_{LO}$ at the $f_{LO}$ sampling rate $f_S$; (6) a section or method to register the two product bitstreams and to alternately combine the two bitstreams into a single interleaved bitstream, $I_{B\Delta\Sigma}*I_{LO}+Q'_{B\Delta\Sigma}*Q_{LO}$, where the resulting bitstream is clocked at $2f_S$, twice the rate of the local oscillator clock sampling rate; (7) a section or method to convert the single bit stream into an analog signal with two well defined output voltages whereby one analog voltage represents the digital high bit and a second analog voltage represents the digital low bit; (8) a section or method to band pass filter the resulting single sideband analog signal whereby the analog filter must have sufficient rejection to reject the noise created from the $\Delta\Sigma$ modulation to the level required for the particular application.

Section (2) comprises an interpolator and register 102 which receives the $Q_{Bn}$ signal and a $f_B$ clock. An interpolator and a register may be provided separately. The $I_{Bn}$ signal is input to a register 104 which also receives a $f_B$ clock.

Section (3) comprises 1 bit $\Delta\Sigma$ modulators 106, 108. Each modulator 106, 108 receives the $Q'_{Bn}$ and $I_{Bn}$, respectively, and a $f_S$ clock.

Section (4) comprises a splitter 110 which receives a local oscillator clock at $f_S$ and outputs the $Q_{LO}$ and $I_{LO}$ clock signals, which are input to multiplexers 112, 114 of section (5), respectively, Section (6) comprises a summer 116, and section (7) comprises a Digital-Analog Converter (DAC) 118 which receives a $2f_S$ clock. Section (8) comprises a band pass filter 120 whose centre is at $f_S/2$, or at odd multiples of $f_S/2$.

The circuit functions just described can be implemented in a wide range of technologies including both discrete and integrated embodiments of the circuits and with a wide range of variants on the methods to implement each functional block.

Figure 1:
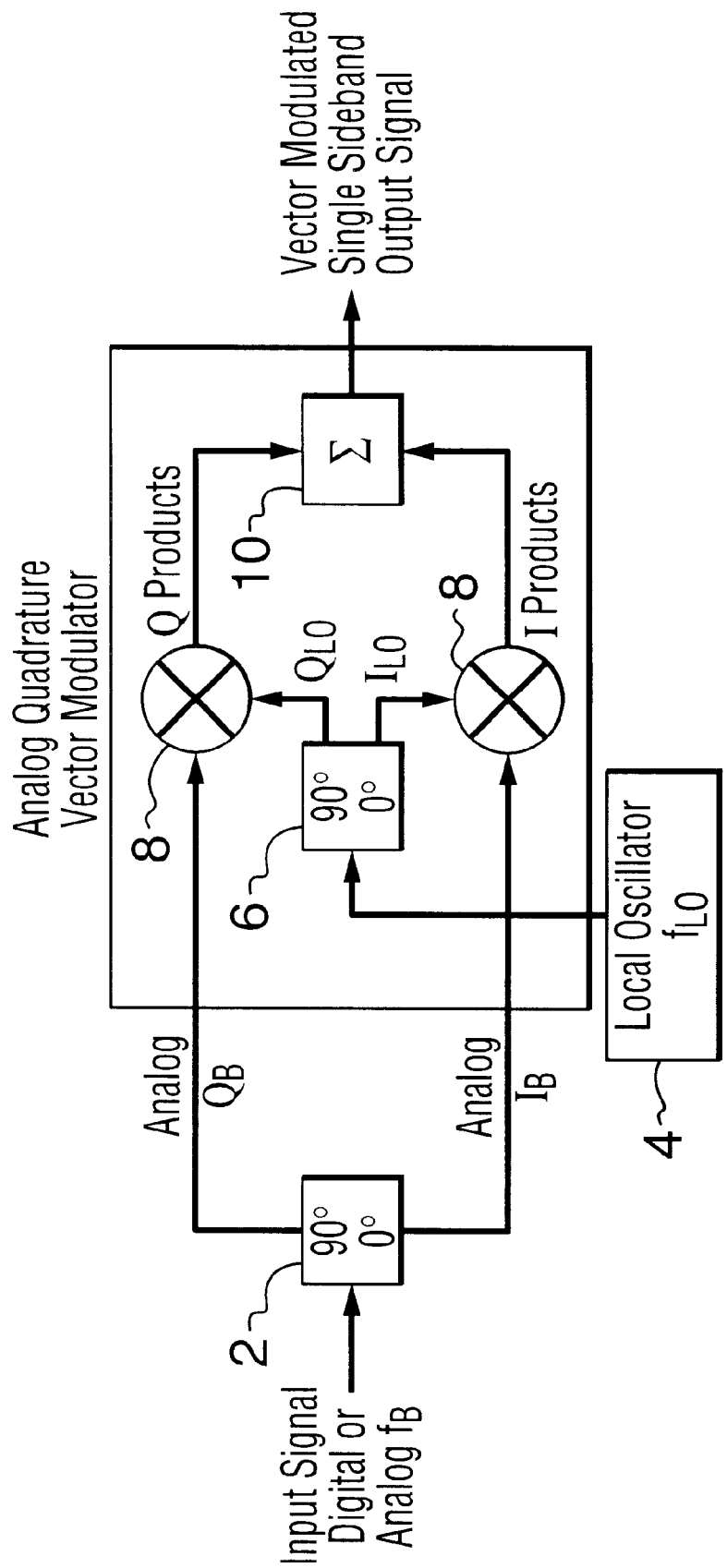
FIG. 1 is an analog quadrature vector modulator.
Figure 2:
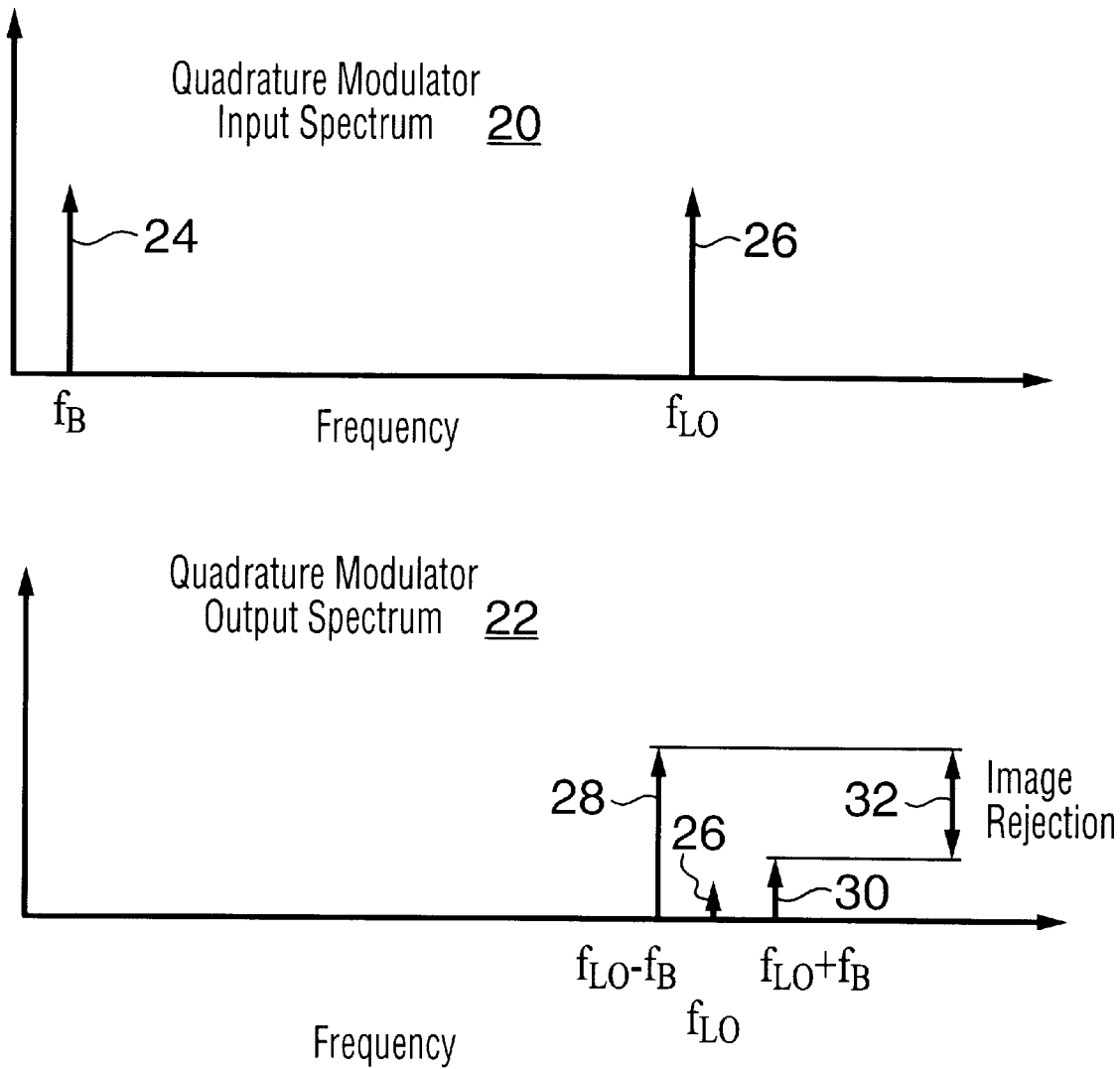
FIG. 2 is a quadrature modulator input and output spectra.
Figure 3:
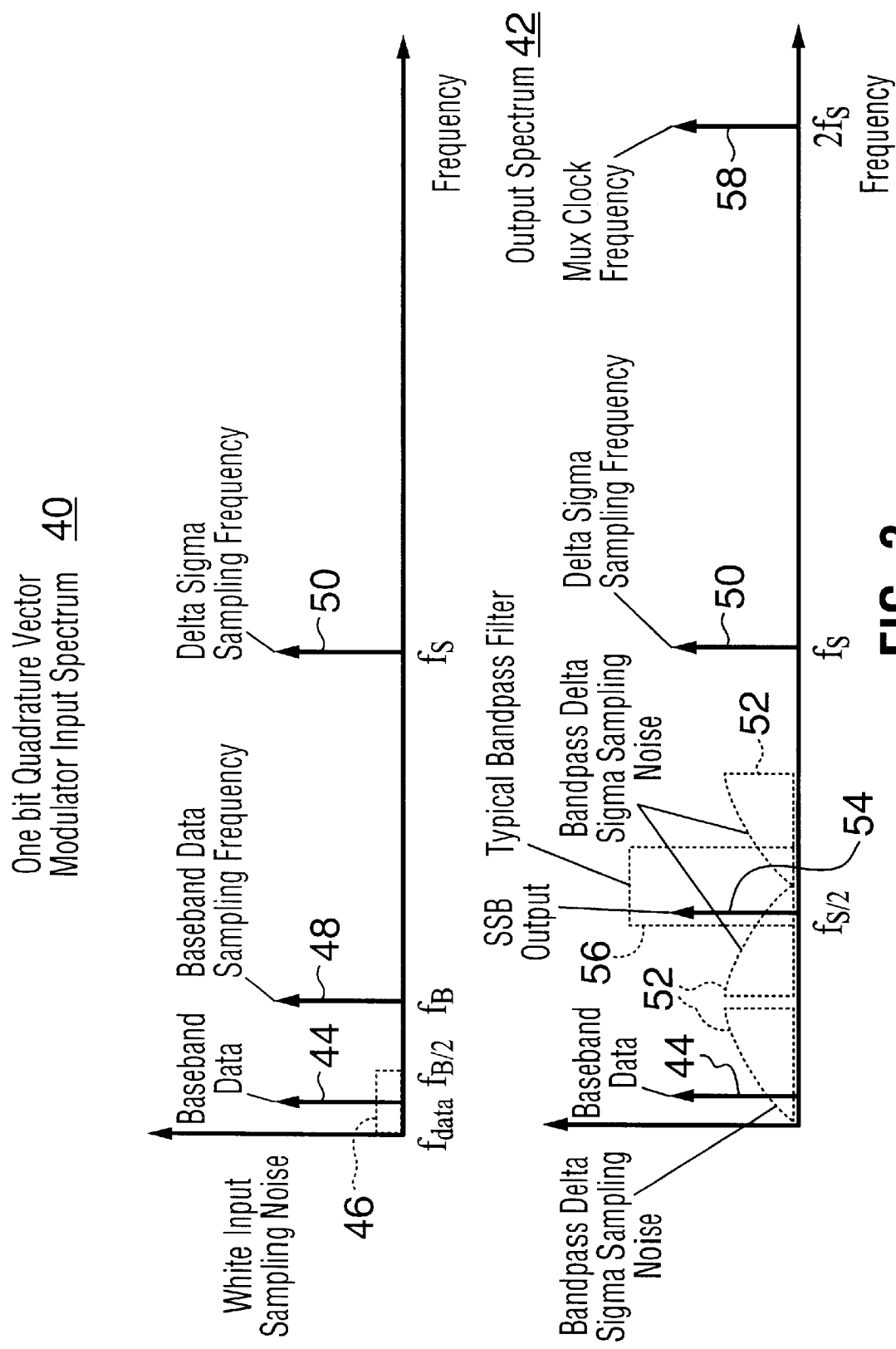
FIG. 3 is a one bit digital quadrature vector modulator input and output spectra.

FIG. 3 shows the input spectrum 40 and the output spectrum 42 of a typical digital Quadrature Modulator using single bit delta sigma modulators. The input I or Q baseband n bit data 44, at frequency $f_{data}$, is represented in the spectrum 40. The baseband signal 44 has white noise 46 at a level which is related to the number of bits of resolution in the samples, n, and the ratio of the baseband data sampling frequency 48, $f_B$.

The n bit baseband data 44 at $f_B$ is then modulated by a delta sigma data converter running at a sampling rate 50 of $f_S$. The output of the I and Q modulators is a single bit each at the $f_S$ rate.

The noise out of the modulators is shaped such that the noise near the data is low and higher in frequency the noise increases. This is represented in the spectrum 42 by the lines marked Baseband Data 44 and the Baseband Delta Sigma Sampling Noise 52.

A similar spectrum exists at the output of the I and Q modulators, where each output represents the I and Q baseband data respectively.

The two modulator outputs are passed through the output mixing and combining stages and are combined into a single output at the $2f_S$ rate. The resulting output spectra is centered at odd multiples of $f_S/2$, a wanted sideband 54 appears in this example at $f_S/2-f_{data}$, a suppressed carrier is at the center of the band and an unwanted upper sideband is suppressed at $f_S/2+f_{data}$. The dotted line 56 represents a typical bandpass filter passband for selecting the first alias output of the SSB output. The multiplexer operates at a mux clock frequency 58, $2f_S$.

Normally the $I_{Bn}$ and $Q_{Bn}$ signals, shown in FIG. 4, exist as multi-bit digital sequences. A preferred method of producing single bit baseband signals for quadrature modulation uses a data interpolator to produce a $Q'_{Bn}$ signal and then uses digital delta-sigma ($\Delta\Sigma$) modulation to convert the multi-bit $I_{Bn}$ and $Q'_{Bn}$ signals into single bit bitstreams, $I_{B\Delta\Sigma}$ and $Q'_{B\Delta\Sigma}$. The noise shaped single bit signals $I_{B\Delta\Sigma}$ and $Q'_{B\Delta\Sigma}$ are multiplied by single bit $I_{LO}$ and $Q_{LO}$ signals and then combined. The resulting single bit, single side band (SSB) $\Delta\Sigma$ data stream represents the bandpass spectrum of the quadrature modulated baseband signals (to the precision of the quantization) with no amplitude or phase mismatch between the I and Q components of the signal. The analog RF spectrum is easily generated from the SSB $\Delta\Sigma$ bitstream by means of a conventional 1 bit Digital-to-Analog Converter (DAC) and Band Pass Filter (BPF). The analog RF spectrum can be demodulated by any standard RF receiver.

The present invention, shown in block diagram form in FIG. 4, makes use of a signal interpolator and two single bit $\Delta\Sigma$ modulators to create single bit, noise shaped, digital baseband representations of multi-bit quadrature input signals. The use of single bit, noise shaped, digital baseband signals enables a digital modulation scheme which is far simpler and requires fewer functional parts than multi-bit modulation methods. An apparatus constructed in accordance with the invention can also run at higher clock rates than multi-bit modulation apparatus. One bit noise shaped single bit $\Delta\Sigma$ oversampling in accordance with the invention is preferred over conventional single bit pulse code modulation (PCM) as they can achieve much higher Signal to Noise ratios for a given sampling rate. Single bit digital quadrature modulation performs in a similar fashion to multi-bit digital quadrature modulation in terms of image rejection, phase and amplitude matching. Hence image rejection is superior to analog modulators.

Using modern semiconductor processes, single bit digital vector modulation can now be implemented at sufficiently high speeds to replace analog vector modulators for a wide number of signal processing and communications applications.

After upconversion to a single sideband, the one bit digital $\Delta\Sigma$ bitstream is converted to analog using a conventional 1 bit DAC. The resulting analog signal has a noise shaped spectrum and is filtered using a conventional band pass filter.

Quadrature bitstreams which have been modulated by an $I_{LO}$ and $Q_{LO}$ clocks must be combined to generate the desired SSB signal. Normally the digital samples from the I and Q bitstreams are combined by summing the signals. If the LO clock phase advances by less than 90° per data sample the required digital summation is complex or complicated, i.e. involves multi-bit numbers, is usually slow and is generally not practical for high speed communications applications. However, if the LO clocks advance by exactly 90° per data sample, that is the data is multiplied by clock signals at only the four distinct phases of 0, 90, 180 and 270 degrees, then every second LO clock sample has an amplitude of exactly zero. Since the LO clocks are offset by 90° no physical summation is required as one or the other clock signal is always zero. Hence, when using the 4 phase clock approach, the modulated quadrature bitstreams may be combined by a simple multiplexer technique. The product of the LO clock and the input signal which occurs when the LO Clock is zero is hence, never used, and need not physically exist. Hence the LO clocks may run in quadrature and only sample the input waveforms at the two phases of 0° and 180° for the cosine clock and 90° and 270° for the sine clock.

The resulting summation is achieved by multiplexing between the two modulated bitstreams at twice the LO clock rate.

Since the actual samples used by the interleaving process are offset by the multiplexer clock period, i.e. $1/(2\times f_S)$, then the baseband input Q data must be sampled at $1/(2f_S)$ seconds later than the I data. This offset in baseband sampling by the small amount of the multiplexer clock rate will lead to perfect image cancellation. Should the offset not be applied to the baseband sampling the DQOM SSB modulation will still function, but with some degradation in the image rejection. If the oversampling rate are high enough, image rejection will still be superior to most (analog) AQVMs regardless of whether or not the offset is applied, but the baseband offset is necessary for many high resolution applications.

It is therefore preferred that the data supplied to the DQVM be offset sampled as described above, and passed to the NQVM synchronously at the common sample rate. Should the I and Q input data be sampled at the same time without offsets, and for practical reasons must be passed to the DQVM as such, and should the image rejection of the non-offset data not be sufficient for the application, then an interpolation circuit is required on one of the input samples, e.g. the Q data, to interpolate between the sample points to determine the value of the Q sample at the offset time. Many types of signal interpolators exist which may be used for this purpose and include such techniques as look up tables, or techniques similar to those described by Ritchie et al. (*Interpolative Digital to Analog Converters* Ritchie, Candy and Ninke, IEEE Transactions on Communications, Vol. COM-22 p. 1797–1806,November 1974). The accuracy of the interpolation will determine the ultimate image rejection achievable. For many applications simple linear interpolation between the sample points would be sufficient to improve image rejection to the desired level for the application.

An example of a hardware method to achieve the simple linear interpolation may be described as follows.

Figure 7:
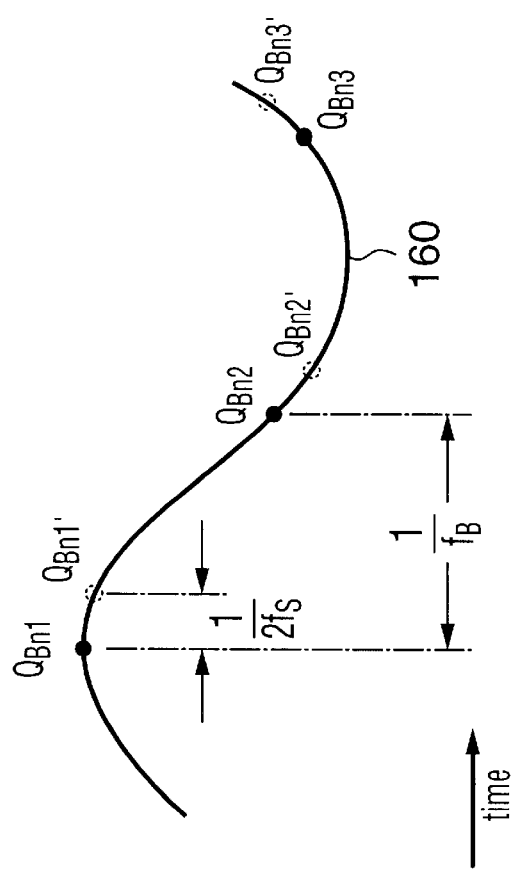
FIG. 7 is a diagram showing an analog representation of is the Q baseband signal.

FIG. 7 shows an analog representation 160 of the $Q_B$ input baseband waveform superimposed on the actual digital samples for illustration purposes. If it is assumed in this example that the $Q_B$ waveform needs to be corrected using the interpolator, then the sequence of n-bit quadrature baseband samples $Q_{Bni}$ may be represented as follow:

$Q_{Bni}=Q_{Bn1}, Q_{Bn2}, Q_{Bn3},$ where i is an increasing integer and the i subscript represents samples taken at the baseband sample rate $f_B$ (samples/seconds), and are hence separated in time by $1/f_B$ (seconds/sample).

If the baseband samples are later delta sigma modulated to create 1 bit versions of the signal at the sample rate $f_S$, and then the samples are interleaved and output as the SSB signal at the $2f_S$ rate, then the interpolation required is the value of $Q_B$ signal at $1/2f_S$ seconds after the actual samples $Q_{Bni}$.

The new sequence will generate a new series of numbers $Q'_{Bni}$.

Figure 8:
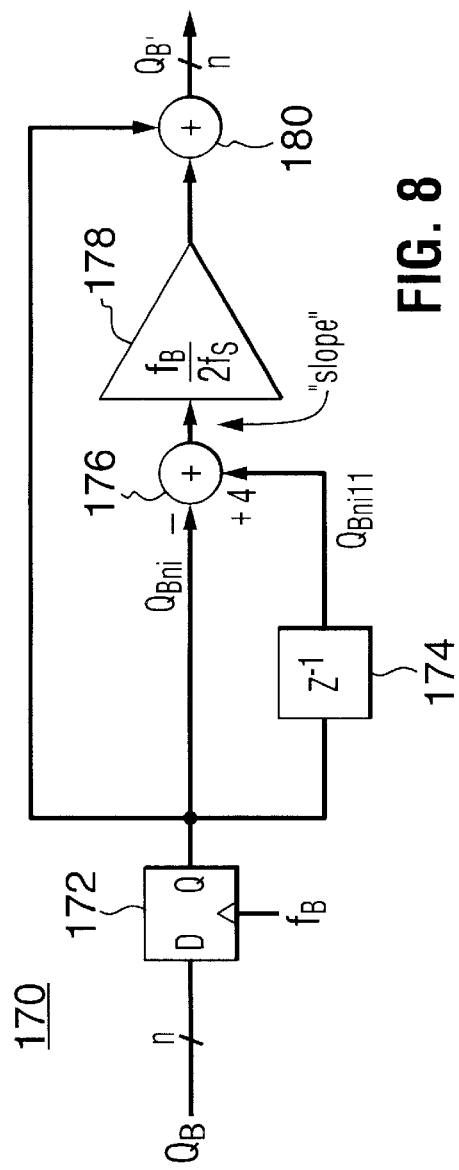
FIG. 8 is an example of a simple linear interpolator which may be implemented in the embodiment of the one bit DQVM shown in FIG. 4.

FIG. 8 shows an example of a simple linear interpolator 170. An n-bit quadrature signal $Q_B$ is input to a register 172 which registers the input signal at a sampling rate of $f_B$. The output of the register 172 is input via a delay unit 174 to a plus terminal of an adder 176, and directly to a minus terminal of the adder 176. Thus, the output of the adder 176 represents a slope of the neighbouring two quadrature signals, e.g. $Q_{Bn1}$ and $Q_{Bn2}$. The output of the adder 176 is multiplied by $f_B/2f_S$ by a gain block 178 to produce an offset value signal. The offset value signal is then added to the original output of the register 172 by an adder 180 so as to output a offset n-bit $Q'_B$ signal.

The simple linear interpolator 170 shown in FIG. 8 realizes the interpolation at $1/2f_B$ later by effectively calculating the slope (i.e. the difference) between any two points $Q_{Bni}$ and $Q_{Bni+1}$,and multiplying the slope by a gain factor equal to the ratio of the desired delay to the baseband sample rate, i.e. $Q'_{Bni}=f_B/(2f_S)*(Q_{Bni=1}-Q_{Bni})$.

The resulting output sequence will have an improved image suppression over a sequence with no interpolation. The image suppression is related to the oversampling ratio and the number of bits used to represent the interpolation. Either one can be increased to realize the necessary image suppression. The choice of which method or combination of methods to use will be dependant upon the practical constraints of the problem such as power consumption, maximum clock speeds, cost etc.

The following describes a simple embodiment of the invention which may easily be realized in an integrated circuit.

FIG. 6 shows the input multi-bit bitstream $I_{Bn}$ and $Q_{Bn}$ where both signals represent samples of the baseband data at $f_B$. Due to the fact that the digital quadrature signals will be interleaved at the output of the DQVM at the $2f_S$ rate, it is necessary that the $Q'_{Bn}$ signal be sampled at $0.5T_S$ ($T_S\approx 1/2f_S$) after the $I_B$ signal. The preferred embodiment is to register the $I_{Bn}$ and $Q_{Bn}$ samples simultaneously into the DQVM, but to offset the effective sampling time of $0.5T_S$ in software or hardware prior to input to the DQVM. Simultaneous clocking of the two input signals greatly simplifies the clock generator circuitry of the DQVM. An error in the sampling time will result in a phase error in the I and Q signals and will result in reduced image suppression as is seen in analog vector modulators. The method shown interpolates the $Q_{Bn}$ signal to create the needed $Q'_{Bn}$ signal in hardware, i.e. a register and interpolator 102. A method is provided to modulate the two bitstreams using any single bit delta sigma modulation technique 106, 108. The resulting output bitstreams at $f_S$ are input into one terminal of exclusive OR (XOR) gates 152, 154, or functional equivalent, and where the other terminal is clocked by a one bit clock $f_{LO}$, also at $f_S$. High bits from the $f_{LO}$ have the effect in the XOR gate 152, 154 of passing the $\Delta\Sigma$ data through unmodified, i.e. with a gain of unity. Low bits from the $f_{LO}$ have the effect in the XOR gate of inverting the $\Delta\Sigma$ data, ie a gain of −1. The single bit synchronous outputs of the two XOR gates 152, 154 are input to a multiplexer 156 which latches the two bitstreams and alternately clocks out the I and Q bit streams at a multiplexer clock of $2f_S$. This is equivalent to inserting zeros between each sample for the I and Q bit streams and results in each bit stream being multiplied by repeating sequences of 1 0 –1 0 at $2f_S$. Since the repeating sequence is four cycles the resulting SSB data will be created at $f_S/2$, and will have aliases at $nf_S/2$ where n is an odd integer. The output of the combined $\Delta\Sigma$ bitstream will be a SSB waveform with a noise null at the centre of the SSB spectrum. The combined $\Delta\Sigma$ bitstream may be converted to an analog waveform with either a zero order sample and hold or Dirac function type DAC 118. The zero order sample and hold version will have a sinx/x rolloff with the first null at $2f_S$. It is important that the output of the DAC have symmetrical rise and fall times to avoid degrading the $\Delta\Sigma$ spectrum noise null. Depending upon the application and the selection of IF output frequency from one of the above aliases, the signal will have a certain amount of sinx/x shaping on the output spectrum. A slightly more complex version of the DAC may be realized using a Dirac impulse function DAC to reduce sinx/x rolloff. Finally a simple band pass filter 120 is required to remove the unwanted $\Delta\Sigma$ aliases and $\Delta\Sigma$ noise from the complex modulated output signal. The bandwidth, order and ultimate rejection requirements of the Band Pass Filter are dictated by is the specific requirements of the modulation scheme being used and the type of $\Delta\Sigma$ modulation used.

FIG. 5 represents the relative timing of select waveforms in the one bit DQVM. Line 130 shows the baseband sampling rate of the input data, $f_B$ clock, line 131 shows the modulator sampling rate at $f_S$; lines 132 and 133 show the orthogonal clock signals $I_{LO}$ and $Q_{LO}$, respectively, which will be multiplied with the $I_{B\Delta\Sigma}$ and $Q'_{B\Delta\Sigma}$ bitstreams by the XORs. Line 134 shows the multiplexer clock rate $2f_S$. The last row 135 shows the output data sequence.

Figure 6A:
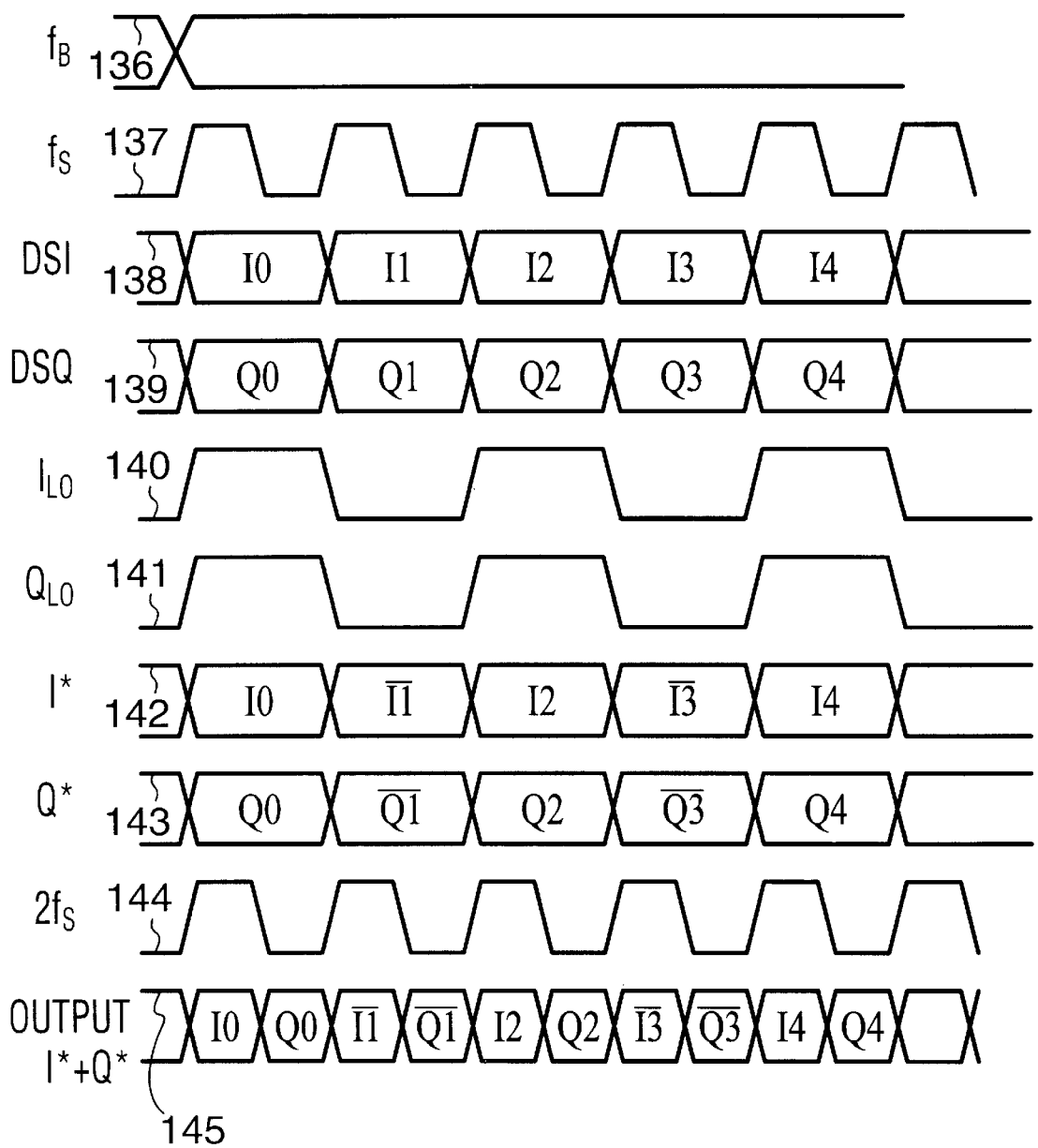
FIG. 6A is a chart showing details of the relative timing of select waveforms in the one bit DQVM of FIG. 6.

FIG. 6A represents more details of the relative timing of select waveforms in the one bit DQVM. The baseband sampling rate of the input data, $f_B$, is slow (line 136) relative to all other waveforms. Both I and Q input data use the same sampling rate at the same phase.

The sampling rate of the I and Q delta sigma modulators, $f_s$, is a high integer multiple of the baseband sampling rate (line 137).

The I and Q delta sigma modulator output data are shown as DSI (line 138) and DSQ (line 139) respectively.

The $I_{Lo}$ (cosine LO) and the $Q_{LO}$ (sine LO) operate at a frequency of $f_S/2$, that is one half of the delta sigma clock (lines 140, 141). Normally the LO signals would have four levels, for example 1, 0 –1, 0 for the cosine LO, and 0,1,0,–1 for the sine LO, however since the interleaved I and Q later on does not require the 0 products, the $I_{LO}$ and $Q_{LO}$ appear identical. In tact we use the DSI and the DSQ data in a fashion equivalent to the output which four level quadrature LO signals would produce.

The product of the DSI waveform and the $I_{LO}$ is shown by I* (line 142) and similarly the DSQ*QLO product is represented by the Q* waveform (line 143). The negative products are achieved by inverting the data when the LOs are in a low state.

Finally the I* and Q* waveforms are summed in an interleaved fashion at the $2f_S$ rate (line 144) to produce the single sideband output data stream. The OUTPUT waveform when viewed in the frequency domain, and after bandpass filtering produces the desired high resolution SSB spectra from the DQVM (line 145).

The one bit technique enables a much faster digital implementation of the digital quadrature vector modulation function than that which can be achieved with conventional multi-bit digital techniques. The digital vector modulator is an improvement over conventional analog vector modulators as it does not suffer from amplitude and phase matching problems seen in analog vector modulators. The DQVM is also an improvement over single bit digital modulators which suffer from reduced image suppression due to sample timing errors, Numerous modifications, variations and adaptations may be made to the particular embodiments of the invention described above without departing from the scope of the invention, which is defined in the claims. For example, in the above preferred embodiments, the quadrature signal $Q_B$ is delayed, but the in-phase signal $I_B$ may be offset rather than $Q_B$. Also, the present invention may be implemented by a computer processor or similar device programmed to execute the method steps described above, or may be executed by an electronic system which is provided with means for executing these steps.

What is claimed is:

1. A method to implement a Digital Quadrature Vector Modulator (DQVM) on two multi-bit input signals to output a one-bit output signal, the method comprising steps of:

performing multi-bit interpolation on one of the input signals at a single baseband sampling rate to provide an offset to the one of the input signals; and performing one bit modulation on the interpolated input signal and the other input signal at a modulator sampling rate which is faster than the baseband sampling rate.

2. The method as defined in claim 1, wherein the multi-bit interpolation performing step is carried out by interpolating one of the two multi-bit input signals by an amount related to the modulator sampling rate; and the one bit modulation performing step is carried out by converting the interpolated input signal and the other input signal to one bit signals using high fidelity single bit delta sigma modulation.

3. A method for producing a single bit stream using digital quadrature vector modulation, the method comprising the steps of:

receiving multi-bit digital in-phase and quadrature input signals at a baseband sample rate;

implementing an offset on one of the input signals at the baseband sample rate;

modulating the offset input signal and the other one of the input signals into single bit delta-sigma ($\Delta\Sigma$) coded bitstreams at a modulator sampling rate which is faster than the baseband sample rate;

creating orthogonal clock signals at a sampling rate equal to the modulator sampling rate and an effective frequency equal to one half of the modulator sampling rate;

multiplying the $\Delta\Sigma$ coded bitstreams with the orthogonal clock signals so as to create two product single bit streams at the modulator sampling rate; and alternately combining the two product single bit streams into a interleaved single bit stream so that the interleaved single bit stream is clocked at a rate twice the modulator sampling rate.

4. The method as defined in claim 3 wherein the step of implementing an offset comprises the step of interpolating the one of the input signals by an amount equal to a period of a clock having a rate twice the modulator sampling rate.

5. The method as defined in claim 3 wherein the step of creating orthogonal clock signals creates the orthogonal clock signals which are represented by single bit words.

6. The method as defined in claim 3 wherein the step of multiplying the ΔΣ coded bitstreams multiplies so that a high clock signal of the orthogonal clock signals will not change one of the ΔΣ coded bitstreams, and the low clock signal of the orthogonal clock signals will invert the other one of the ΔΣ coded bitstreams.

7. The method as defined in claim 3 further comprising the step of converting the interleaved single bit stream into an analog signal to produce a single sideband analog signal.

8. The method as defined in claim 7 wherein the step of converting the interleaved single bit stream converts the interleaved single bit stream with high and low output analog voltages so that the high analog voltage represents a digital high bit and the low analog voltage represents a digital low bit.

9. The method as defined in claim 7 further comprising the step of filtering the single sideband analog signal so as to reject noise, which is created from the step of modulating the offset input signal and the other one of the input signals, to a predetermined level.

10. A Digital Quadrature Vector Modulator (DQVM) system comprising:

an offset implementing unit for implementing an offset on one of multi-bit digital in-phase and quadrature input signals received at a baseband sample rate;

a first one bit delta-sigma (ΔΣ) modulator for receiving and modulating the offset input signal at a modulator sampling rate which is faster than the baseband sample rate, and outputting a single bit ΔΣ coded bitstream of the offset input signal;

a second one bit ΔΣ modulator for receiving and modulating at the modulator sampling rate a non-offset input signal which is the other one of the input signals, and outputting a single bit ΔΣ coded bitstream of the non-offset input signal;

means for creating orthogonal clock signals at a sampling rate equal to the modulator sampling rate and an effective frequency equal to one half of the modulator sampling rate;

a first multiplier for multiplying the ΔΣ coded bitstream of the offset input signal with one of the orthogonal clock signals so as to create a first product single bit stream based on the offset input signal;

a second multiplier for multiplying the ΔΣ coded bitstream of the non-offset input with the, other one of the orthogonal clock signals so as to create a second product single bit stream based on the non-offset input signal; and a multiplexer for alternately combining the first and second product single bit streams into a interleaved single bit stream so that the interleaved single bit stream is clocked at a rate twice the modulator sampling rate.

11. The DQVM system as defined in claim 10 wherein the offset implementing unit comprises an interpolator which interpolates the one of the input signals by an amount equal to a period of a clock having a rate twice the modulator sampling rate.

12. The DQVM system as defined in claim 11 wherein the interpolator comprises:

a delay unit for receiving the one of the input signals to output a delayed signal;

a first adder for adding the delayed signal to the one of the input signals so as to output a slope signal;

a gain block for multiplying the slope signal so as to output an offset value signal; and a second adder for adding the offset value signal to the one of the input signals so as to output the offset input signal.

13. The DQVM system as defined in claim 10 wherein the means for creating orthogonal clock signals creates the orthogonal clock signals which are represented by single bit words.

14. The DQVM system as defined in claim 10 wherein the means for creating orthogonal clock signals comprises:

a local oscillator for generating a local clock signal at the modulator sampling rate; and a splitter for splitting the local clock signal into the orthogonal clock signals.

15. The DQVM system as defined in claim 10 wherein the first and second multipliers multiply so that a high clock signal of the orthogonal clock signals will not change one of the ΔΣ coded bitstreams, and the low clock signal of the orthogonal clock signals will invert the other one of the ΔΣ coded bitstreams.

16. The DQVM system as defined in claim 10 wherein each of the first and second multipliers comprises an exclusive OR gate.

17. The DQVM system as defined in claim 10 further comprising a digital to analog converter for converting the interleaved single bit stream into an analog signal to produce a single sideband analog signal.

18. The DQVM system as defined in claim 17 wherein the digital to analog convertor converts the interleaved single bit stream with high and low output analog voltages so that the high analog voltage represents a digital high bit and the low analog voltage represents a digital low bit.

19. The DQVM system as defined in claim 17 further comprising a band pass filter for filtering the single sideband analog signal so as to reject noise, which is created during the modulation by the first and second ΔΣ modulators, to a predetermined level.

20. The method as defined in claim 1 further comprising a step of:

modulating the one bit signals by using one bit quadrature modulating signals.

21. A Digital Quadrature Vector Modulator (DQVM) for acting on two multi-bit input signals to output a one-bit output signal, the system comprising:

a multi-bit interpolator for interpolating one of the input signals at a single baseband sampling rate to provide an offset to the one of the input signals;

a first one bit modulator for modulating the interpolated input signal at a modulator sampling rate which is faster than the baseband sampling rate; and a second one bit modulator for modulating the other input signal at the modulator sampling rate.

22. The DQVM as defined in claim 21, wherein the multi-bit interpolator interpolates the one of the input signal by an amount related to the modulator sampling rate; and the first and second one bit modulators are single bit delta sigma modulators.

23. The DQVM as defined in claim 21 further comprising a modulator for modulating the one bit signals by using one bit quadrature modulating signals.

* * * * *